United States Patent [19]

Bowling

[11] 4,252,390
[45] Feb. 24, 1981

[54] LOW INSERTION FORCE ELECTRICAL RETAINER

[76] Inventor: William M. Bowling, 5321 E. Calle Del Medio, Phoenix, Ariz. 85018

[21] Appl. No.: 28,257

[22] Filed: Apr. 9, 1979

[51] Int. Cl.$^3$ .............................................. H01R 13/62
[52] U.S. Cl. .............................. 339/17 CF; 339/75 R
[58] Field of Search ............. 339/17 CF, 176 MP, 19, 339/174, 17 M, 147 R, 91 R; 174/52 FP; 361/212, 310, 384–389; 206/328, 331

[56] References Cited

U.S. PATENT DOCUMENTS

| | | | |
|---|---|---|---|
| 3,582,865 | 6/1971 | Franck | 361/386 X |
| 3,719,917 | 3/1973 | Fischer | 339/174 X |
| 3,753,211 | 8/1973 | Pauza | 339/91 R X |
| 3,831,131 | 8/1974 | Woodcock | 339/17 CF X |
| 3,908,153 | 9/1975 | Cason | 339/19 X |
| 3,963,319 | 6/1976 | Schumacher | 339/17 F X |
| 4,019,094 | 4/1977 | Dinger et al. | 339/19 X |

FOREIGN PATENT DOCUMENTS 1640005  5/1970  Fed. Rep. of Germany ...... 339/17 CF

Primary Examiner—John McQuade
Assistant Examiner—John S. Brown
Attorney, Agent, or Firm—Gregory J. Nelson

[57] ABSTRACT

A retainer for securing electrical components such as IC's to a PCB requiring low or zero insertion force formed having spring biasing locking means for applying retaining contact pressure between the leads or contacts of the IC and a connector. In the preferred embodiment the retainer is in the form of a channel having a plurality of depending legs, each of which is adapted to engage the contacts in an operative position. In other embodiments, the spring retainer may be an elastomeric pad. In still another embodiment the retainer includes a lip or flange engageable with one portion of the component and the spring by contacts associated with the connector which apply an opposite biasing force. In still other embodiments the spring retainer is integrally formed in the depending contact lead, the IC or component.

2 Claims, 21 Drawing Figures

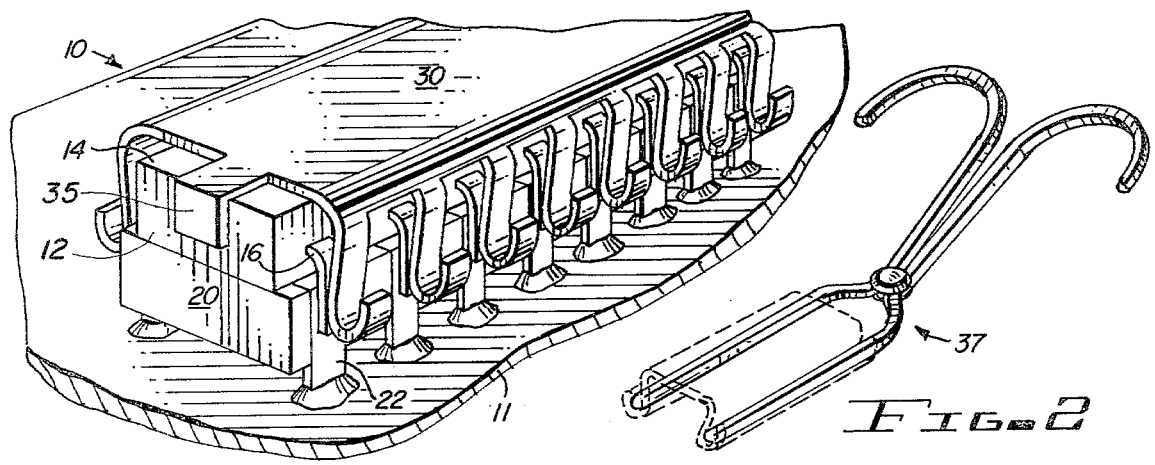
FIG.–1
FIG.–2
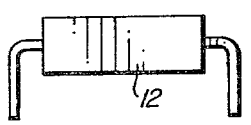
FIG.–3A
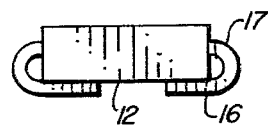
FIG.–4A
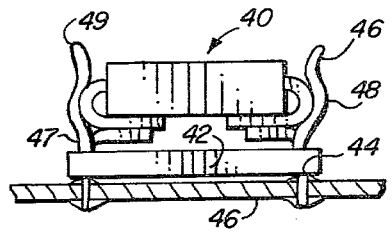
FIG.–4B
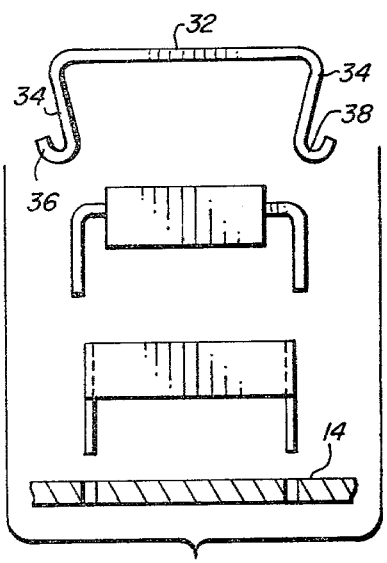
FIG.–3B
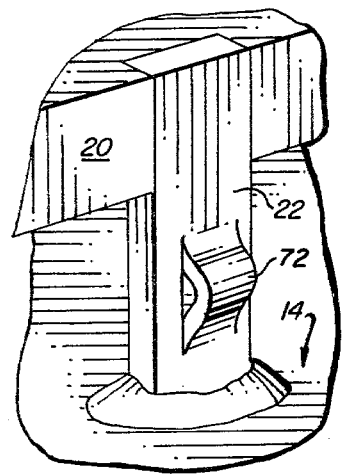
FIG.–5
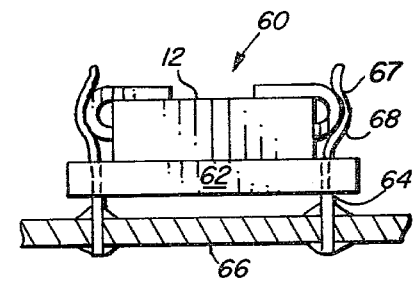
FIG.–6
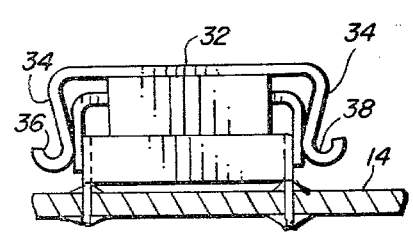
FIG.–3C
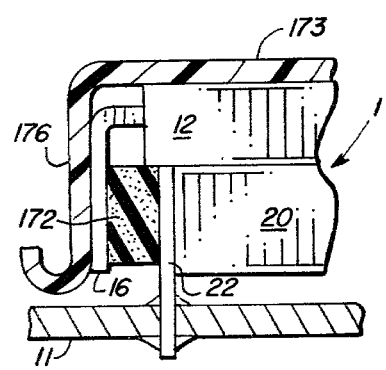
FIG.–13A
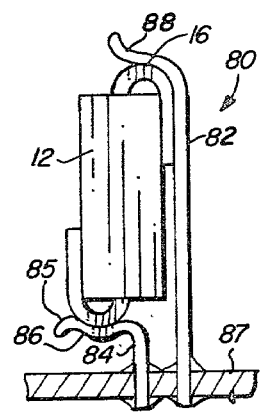
FIG.–6B

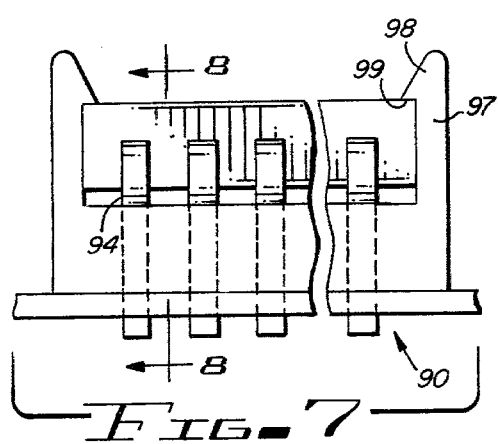
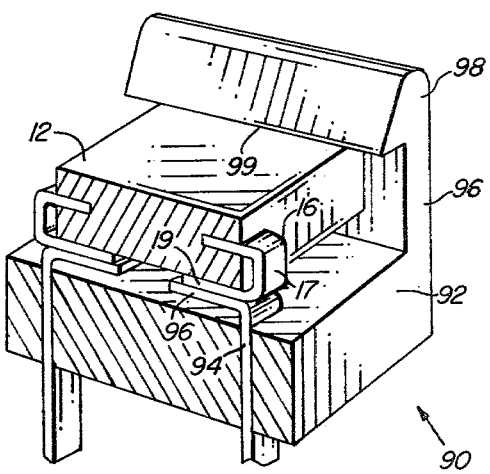
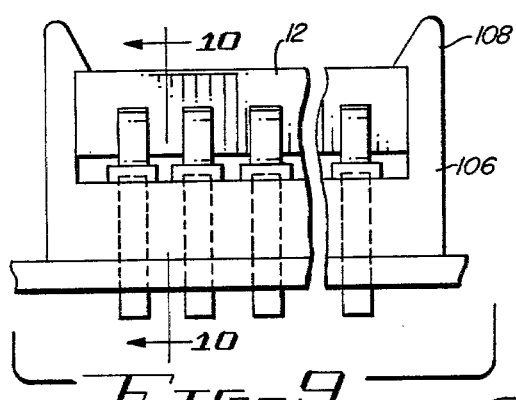
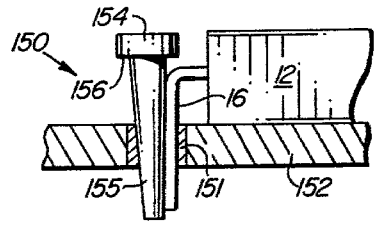
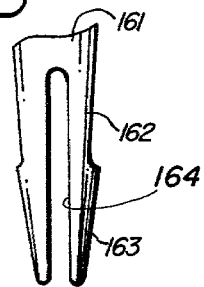
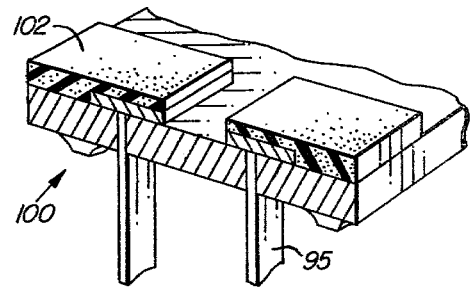
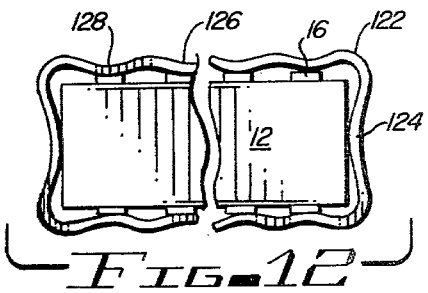
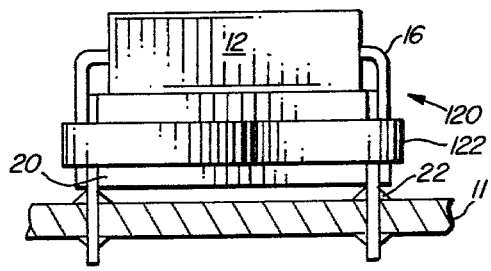
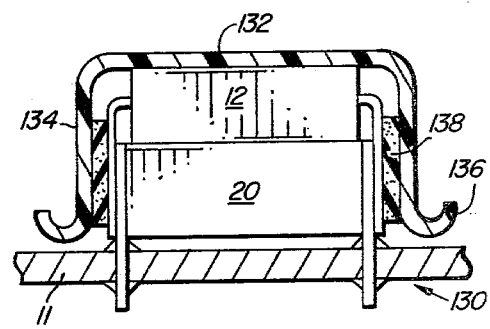
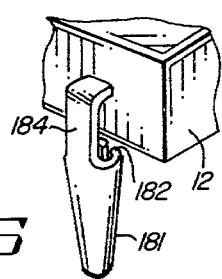

LOW INSERTION FORCE ELECTRICAL RETAINER

The present invention relates to an electrical retainer for enabling the convenient connection and disconnection of an electrical circuit package. More particularly, the invention relates to a low or zero insertion force electrical connector for connecting an integrated circuit (IC) device to a printed circuit board (PCB) to prevent lead damage.

The most widespread package for digital integrated circuits is the dual in-line (DIP) device which usually consists of a plastic encapsulation or heat resistant material of some other type such as a ceramic. These devices have been accepted because of their low price and relatively easy installation in printed circuit boards. These devices have two parallel rows of contacts or leads disposed in-line along the respective opposite sides of the package. The DIP's are designated by the number of leads, 14 lead and 16 lead packages being quite common. The leads or contacts can be used as soldering leads or can be inserted into sockets in connectors.

The connector sockets are generally constructed to exert fairly high compressive force on the leads of the DIP device in order to insure electrical contact between the socket contact and the device leads. It is often necessary for the technician to exert considerable manual thrust on the leads to insert the device into the socket. Such a force applied to a small package often results in bending and damage of the leads. Further, since the technician is often working in a restricted area, this procedure is difficult when attempted manually or without the aid of a special tool.

Several attempts have been made in the prior art to provide connectors which minimize the axial or plugging insertion force required when inserting devices into a connector. One device recently marketed is provided with a series of contact containing apertures on either side of the connector housing for receiving the device leads. An actuating cam, operable by a screwdriver or other tool, allows the technician to open or close all the contacts so that insertion or extraction force is minimized. While this device is effective, it is relatively complex having substantial number of relatively small mechanical components, thus contributing to the complexity and cost of the device.

Another device of a somewhat similar nature is described in U.S. Pat. No. 3,820,054. This patent shows an electrical connection socket for securement to a PCB to enable connection of an IC device to the board. The connector includes side members hinged on a base member moveable from a biased non-operative position to an operative position in which the hinges press together the associated socket and plug contact members to provide good contact. Again, while the device is effective, the device incorporates mechanically complex components in a relatively small size device increasing the cost.

Accordingly, the present invention provides a simple, reliable and cost effective retainer device for securing electrical components such as IC's to a PCB requiring minimal or zero insertion or plugging force. The device of the present invention is compatible with various electrical devices or packages, such as DIP's encapsulated in a plastic or ceramic or leadless inverted devices (LID) or other types of electrical components having contacts or leads depending from the device. According to the present invention, devices can be inserted in printed circuit boards or other circuit modules with substantially no insertion or extraction force. According to the present invention, spring biased locking means are provided for retaining contact pressure between the leads or contacts of the device and the pins of the connector in the electrically operating position. The spring biasing means may, in the preferred embodiment, be a channel having spring biasing legs which engage the contacts in the operative position. In other embodiments, the spring retaining means may be in the form of conductive elastomeric pads over the contacts and retaining means which can be placed to force the connector and device into electrical contact. In still another embodiment, the spring elements may comprise part of the leads on the device.

The above and other objects and advantages of the present invention will become more apparent from the following specification, claims and drawings in which:

FIG. 1 is a perspective of the preferred embodiment of the retainer of the present invention shown in place on an integrated circuit device.

FIG. 2 illustrates an expansion tool for attachment and removal of the retainer shown in FIG. 1;

FIG. 3A is an end view of an electrical device shown in FIG. 1;

FIG. 3B is an exploded end view of the retainer, electrical device, connector and PCB;

FIG. 3C is an end view of the retainer shown in FIG. 1 in an assembled position;

FIG. 4A is an end view of a device with the leads bent inwardly;

FIG. 4B is an end view showing another form of the electrical component retainer of the present invention with the device of FIG. 4A;

FIG. 5 is a detailed view of one pin of the connector modified to improve the electrical contact characteristics between the device and the connector;

FIG. 6 is an end view of still another embodiment of the present invention showing a device retained in place by the electrical component retainer of the present invention;

FIG. 6B shows still another embodiment of the present invention;

FIG. 7 is a side view of still another embodiment of the present invention in an operative position;

FIG. 8 is a sectional view taken along lines 8—8 of FIG. 7;

FIG. 9 is a side view of still another embodiment of the present invention;

FIG. 10 is a sectional view taken along lines 10—10 of FIG. 9;

FIG. 11 is an end view of another embodiment of the retainer device of the present invention;

FIG. 12 is a plan view of the retainer device shown in FIG. 11;

FIG. 13 is an end view showing another embodiment of the retainer of the present invention incorporating an elastomeric contact material;

FIG. 13A is an end view showing still another embodiment of the retainer of the present invention similar to that shown in FIG. 13;

FIG. 14 is a detail view of an electrical device and contact pin inserted into a PCB showing still another form of the retainer of the present invention;

FIG. 15 is a detail view illustrating a modification of the embodiment shown in FIG. 14; and FIG. 16 shows yet another embodiment of the present invention.

Turning now to the drawings, FIG. 1 illustrates a preferred form of the present invention generally designated by the numeral 10. An electrical device or component 12 is in electical connection with electric module 11 shown as printed circuit board. Electric component or device 12 is shown as an electrical circuit package of the integrated circuit type having a generally rectangular body 14 with a series of protruding leads or contacts 16 spaced apart at either side of the body. The construction of the electric circuit package 12 is well-known and as used herein the term "device" is to be interpreted broadly including any electrical or integrated circuit packages housed in an appropriate thermal setting resin, ceramic or other material.

The body of the connector 20 is comprised of a block of insulating material with conductive legs or pins 22 embedded or otherwise attached to the block 20. The legs are spaced on the same centers as the leads 16 of the device 12. The body of the connector is dimensioned so that the device 12 can be placed over the body with the contacts 16 of the device in overlapping engagement with the connector legs 22. Preferably, the connector 20 is dimensioned and sized so that there is a slight interference to slight clearance between the leads 16 and the legs 22 in the order of several thousands of an inch. The connector legs 22 may be readily inserted into holes or apertures in the printed circuit board 11. The legs 22 can be flow soldered or otherwise connected to PCB 11 on the reverse side of the board.

With the device 12 in place straddling the connector 20, spring retainer 30 can then be placed in engagement with leads 16 forcing the leads 16 transversely into electrical contact with the adjacent legs 22 of the connector. The construction of the spring retainer member 30 is best seen in FIGS. 1, 3B and 3C. Spring retainer member 30 is generally channel shaped in cross-section having a top 32 and a series of spaced-apart oppositely depending legs 34 which are inclined slightly inwardly as best shown in FIG. 3B. The lower end of legs 34 each are turned upwardly at 36 in a generally U-shape forming a longitudinal slot 38 which extends along the exterior edges of legs 34. Guide tab 35 projects downwardly from the opposite ends of top 32 and is engageable with the end face of device 12 to assist in properly positioning the retainer. Retainer 30 could be formed as a single channel however the plurality of legs 34 better accomodates slight positional variances.

Retainer 30 may be constructed of insulated metallic spring material or a plastic or elastomeric material. It will be observed that the transverse dimension between the inward most location of opposite legs 34 is less than the corresponding transverse dimension between the contacts 16 of device 12.

In use, retainer 30 is placed over the device 12 as shown in FIG. 3B with the legs 34 urging the contacts 16 and legs 22 transversely into engagement inducing contact pressure between them in an operative position. A tool 37, as shown in FIG. 2, may be helpful in positioning the retainer. Tool 37 engages U-shaped channel 38 and separates legs 34. The U-shaped channel 38 is not essential for electrical connection but is useful in positioning the retainer in engagement with all of the legs 34.

FIGS. 4A and 4B illustrate another embodiment of the present invention. In FIG. 4A the device 12 is shown having opposite legs 16 bent inwardly at bight portion 17 to engage the underside of the device 12. FIG. 4B shows the device 12 inserted in place in spring retainer which is generally indicated by the numeral 40 and includes a connector body 42 having legs or pins 44 depending into holes or apertures in the subjacent printed circuit board 46. The upper ends of the contacts 44 are formed as spring legs 46 having an intermediate portion 48 which flares and is contoured to engage the bight portion 17 in legs 16. The number of legs 46 corresponds to the number of leads or contacts in the associated device 12. The upper end of legs 46 are bent slightly outwardly to allow the technician to manually separate the legs to insert the device 12 as shown in FIG. 4B. A flange or platform 47 extends transversely inwardly from each of the legs and serves to further support the device 12. Again, the spring retainer members 46 are fabricated from a material having suitable spring and electrically conductive characteristics.

FIG. 6 shows a modification of the present invention generally designated by the numeral 60. In this embodiment the connector body 62 is electrically connected to subjacent PCB 66 by depending contact pins 64 soldered in place at apertures in the board 66. Spring legs 67 extend upwardly from the body 62 transversely spaced-apart to accomodate insertion of the device 12. Legs 66 are again fabricated from a material having spring characteristics so that the legs may be transversely separated when the device 12 is inserted and the legs then exerting transverse compressive force against the bent leads 16. With the embodiment 60 shown in FIG. 6, the body 62 serves as a platform or support for the device 12 and the devices are inserted with the bent contacts 16 of the device 12 facing upwardly. The ends of legs 66 may again be turned outwardly to facilitate insertion of the device 12. The legs 66 may be separated by any manual separation force such as by use of a pair of tongs or fingers so that once the device 12 is inserted, the legs 66 and contact 16 are in good electrical connection.

FIG. 5 shows a modification of connector pin 22 as shown in FIG. 1. Connector pin 22 depends from connector body 20 into aperture in printed circuit board 14. A section of the leg 22 has been raised outwardly by a mechanical punch or other tool forming a projection 72 which serves to further insure electrical connection between the connector leg 22 and the engaging contact 16 of the device. Such projections, designed to increase contact point pressure, are known and used in the industry.

FIG. 6B shows still another form of the spring retainer device of the present invention. As shown in FIG. 6, the device 12 is provided with the legs or contact 16 which are reversely bent, one leg being bent to engage one surface of the device 12 and the other leg being reversely bent to engage the opposite surface. The spring retainer 80 comprises two spaced-apart spring members 82 and 84 each being inserted in an appropriate aperture in the PC board 87 and appropriately soldered or otherwise secured in place. Spring members 82 and 84 are horizontally spaced-apart a predetermined distance. Member 84 is provided with a flange 85 which has a convex portion which engages the bight portion of the lower leg 16. Similarly, spring member 82 is formed having a flange portion 88 which is also contoured to engage the bight portion of the upper leg 16. The flange portions 85 and 86 are suitably formed from a conductive material having spring characteristics and may be vertically spread apart to facilitate insertion of the device 12. When the separation pressure is released, the flanges 85 and 86 are permitted to return to their position as shown in FIG. 6B in electrical contact with the opposite legs 16 of the device 12. Again, the number of retainers corresponds to the number of contacts or leads 16 on the device 12. An insulating shell or body may be placed around the flange contacts or the contacts may be embedded or molded into an insulating body.

FIGS. 7 and 8 show still another embodiment of the present invention generally indicated by the numeral 90. In this embodiment, the device 12 is again configured with the leads 16 bent with the ends 19 of the leads engaging the underside of the device 12 and having a bight section extending along the opposite sides of the device. Spring retainer 90 includes a body having a generally flat rectangular section 92 extending in parallel relationship to the subjacent PCB. A plurality of contacts 94 extend through the body at selected spaced-apart locations adapted to align with the contact leads 16 of the device. The upper ends 96 of the legs 96 are inwardly bent to form spring contacts adapted to align with the ends 19 of the leads 16 of the device 12. End walls 97, provided at opposite ends of body 92, each terminate at upper end section 98 which has a shoulder forming a lip or flange adapted to engage the upper surface of the device 12. As seen, device 12 is inserted between the opposite end walls 97 with the lead ends 19 aligned with the upper ends 96 of the legs 94 of the retainer 90. The upper ends 96 of the legs 94 exert an upward spring force on the entire device 12 so that the device is held in tight engagement between the contact ends 96 and the retainer flanges 99.

It will be seen that good electrical contact is maintained between the contact leads of the device and the contacts of the spring retainer. The device 12 can easily be inserted or removed by horizontally spreading the opposite end walls 97 of the retainer.

FIGS. 9 and 10 show still another embodiment of the present invention similar to that shown in FIGS. 7 and 8. In this embodiment, the upper ends of legs 95 are formed terminating at an elastomeric conductor pad 102. Elastomeric pad 102 is located on the upper surface of the connector body at locations corresponding to the ends 19 of the lead members of the device, the device being formed as shown in FIG. 8. The resilient conductive material can be of the type shown in U.S. Pat. No. 4,008,300 and will deform upon application of pressure still serves as a conductor for electrical current.

When the device 12 is placed between the opposite end 106 of the spring retainer 90 and a downward pressure applied, the elastomeric pads 102 will compress. The opposite ends 106 of the retainer may be spread to facilitate insertion of the device 12. The device 12 and contacts 16 are held in electrically conductive engagement with the elastomeric pads by the upward biasing force exerted by the pads and retained in place by inwardly projecting flanges 108 on the end legs 106.

FIGS. 11 and 12 illustrate still another embodiment of the present invention generally indicated by the number 120. Again, the device 12 is as has been described with the depending contact leads 16 engaging or straddling the contacts 22 of connector body 20. The depending legs of connector body 20 are secured to a subjacent PC board or other electrical module 11. The retainer device comprises a continuous band 122 of non-conductive material or insulated metallic spring material. The band is formed having opposite end walls 124 and side walls 126. The side walls are formed having a series of integrally formed projections 128 which inwardly depend to engage the leads 16 of the device to force the contact leads 16 into tight mechanical and electrical engagement with the adjacent contacts 22 of the connector base. The band 124 is formed of a suitable material having spring characteristics which may be deformed to facilitate insertion of the band about the assembly and which will exert an appropriate transverse contact inducing pressure when in place.

FIG. 13 shows a modification of the device shown in FIG. 1 and is generally designated by the numeral 130. Again, the device 12 is positioned in a straddling position on body 20 of the connector which is secured mechanically and electrically to an electrical module 11. Spring retainer 130 is in the form of a channel having a top 132 and opposite depending legs 134 terminating at a lower lip 136. An elastomeric non-conductive pad is located at the interior of opposite legs 136 at locations corresponding to the location of the contacts 16 of the device 12. Again, the retainer is made of an appropriate material having spring characteristics so that legs 134 can be transversely separated to allow insertion of the spring retainer over the device 12. The elastomeric pads 138 further tend to impose a transverse contact inducing force applied to the contacts 22 and 16.

A modification of the embodiment shown in FIG. 13 is illustrated in FIG. 13A. In this embodiment, generally designated by the numeral 170, device 12 is positioned on connector 20. An elastomeric conductive pad 172 is inserted between the lead 16 of device 12 and leg 22 of connector 20. Spring retainer 170 is in the form of a channel having a top 173 and opposite depending legs 176 which may be continuous or segmented as shown in FIG. 1. The retainer is fabricated from an appropriate non-conductive material having suitable spring characteristics and along with pad 172 imposes a transverse force urging the contact leads and legs together to maintain good electrical contact.

FIG. 14 shows another embodiment of the present invention generally designated 150. In this embodiment the device 12 has depending contacts 16 which are directly inserted into holes 151 in subjacent module 152. To maintain good electrical contact between the contacts and the board, retainer element 154 is shown having an elongate tapered body section 155 with an enlarged head 156 at the upper end. Tapered body can be thrust downwardly in the aperture 151 until the contact 16 is in tight engagement with the aperture. The enlarged head 156 facilitates manual insertion of the retainer 154 with a suitable tool. The retainers may be solid or spring construction and may be provided with axial or radial serrations or ridges along the body 155 to increase point contact pressures. The individual retainers 150 can be supplied to the user secured to a dispenser tape at spaced apart locations in "Bandolier" fashion. The technician would simply cut-off the desired length of tape with the retainers located at predetermined spacing corresponding to the spacing of apertures 151.

FIG. 15 shows a modification of the retainer device in which the contacts 161 of the device are formed having integral spring characteristics. Contact 161 terminates at an enlarged end 163 which is adapted to be placed in an aperture or bore in electric module such as a PCB. An elongate axial slot 164 is shown in the body 161 so that the contact 161 will be of a transverse dimension greater than the hole into which it is to be inserted. Slot 161 allows the opposite halves of the body 162 to compress inwardly when inserted in the hole thereby maintaining good electrical contact with the electric module.

In FIG. 16 the lead 184 of device 12 is formed having a truncated tubular body 181 with axial slot 182. The body 181 can be inserted a desired depth in the aperture in a module until good contact is established.

It will be obvious with the present invention, that when the device is inserted, little or no mechanical contact occurs. Therefore, the device has to be subjected to a relatively low or no insertion force when plugging the device in place. The possibility of damage from accidental high side thrust is minimized. This enables the technician to easily connect the device even in a relatively hard to reach location.

It will be obvious to those skilled in the art to make various changes and modifications, to the extent such modifications and changes do not depart from the spirit and scope of the appended claims, they are intended to be encompassed therein.

I claim:

1. A retainer for mounting an electrical device having a body having depending spaced-apart contact leads to an electrical module at a connector having a body with spaced-apart contact pins with the device body in juxtaposition with the said connector body and with the contact leads and pins in engagement, said retainer comprising: an elongate body member, a series of spaced-apart discrete deflectable leg members oppositely extending from said body member and each adapted to engage at least one of said contact leads and pins urging said contact leads and pins into conductive engagement, the lower distal end of sad leg members being reversely bent forming an elongate channel for reception of a tool to separate the leg members to assist in inserting the leg members over the contact leads and pins, guide tab extending from said body member adapted to engage a portion of the device at a predetermined location, said retainer being formed of a nonconductive material.

2. The retainer of claim 1 wherein said retainer includes an elastomeric material at the inner surface of said leg members.

* * * * *